US006693577B2

(12) United States Patent
Yamamoto

(10) Patent No.: US 6,693,577 B2
(45) Date of Patent: Feb. 17, 2004

(54) INTEGRATION TYPE A/D CONVERSION METHOD, INTEGRATION TYPE A/D CONVERTER, AND BATTERY CHARGER UTILIZING SUCH CONVERTER

(75) Inventor: Kenji Yamamoto, Kyoto (JP)

(73) Assignee: Rohm Co., LTD, Kyoto (JP)

( * ) Notice: Subject to any disclaimer, the term of this patent is extended or adjusted under 35 U.S.C. 154(b) by 0 days.

(21) Appl. No.: 10/198,201

(22) Filed: Jul. 16, 2002

(65) Prior Publication Data

US 2003/0016154 A1 Jan. 23, 2003

(30) Foreign Application Priority Data

Jul. 19, 2001 (JP) ....................................... 2001-219230
Jul. 19, 2001 (JP) ....................................... 2001-219233

(51) Int. Cl.[7] ................................................ H03M 1/12
(52) U.S. Cl. ........................ 341/155; 320/132; 324/428
(58) Field of Search .......................... 341/155; 324/436, 324/428; 327/77; 320/132

(56) References Cited

U.S. PATENT DOCUMENTS 4,153,867 A * 5/1979 Jungfer et al. .............. 324/436
5,769,873 A * 6/1998 Zadeh ......................... 607/29
5,841,284 A * 11/1998 Takahashi ................... 324/428
6,081,140 A * 6/2000 King ........................... 327/77
6,157,170 A * 12/2000 Noda et al. ................. 320/132

* cited by examiner

*Primary Examiner*—Jean Jeanglaude
(74) *Attorney, Agent, or Firm*—Hogan & Hartson

(57) ABSTRACT

In the invention, an integrator integrates a current indicative of an input signal to generate at its output end a voltage (referred to as integral output voltage) by means of a condenser. At a point in time when the integral output voltage has reached a predetermined level, or at a point in time determined by timing of a predetermined period, the integral output voltage is reduced in absolute value by flowing into or out of the condenser a constant current supplied by a constant current source. The direction of the constant current depends on the polarity of the output of the integrator. A counter counting up or down clocks stops counting while the constant current is flowing. This permits use of a low-frequency A/D converter to convert the input signal at a reduced power and extend the dynamic range of the A/D converter.

3 Claims, 9 Drawing Sheets

701
702
COMPARATOR
703
704
COUNTER
705
CLOCK GENERATOR
706
C
OP
R
R
Ea
-ΔVt
p
r
s
R
S
Q
Q̄
S1
S2
-Es
Ei

REGISTER
DATA
40
30
LO3/TCn
viii
SW7
O
COUNTER
R
TC2
U
CLOCK GENERATOR
50
CLK
EXT
SW5
vi
LO1
20
LO3
LOGIC CIRCUIT
TC1/TC3/TC4
TCn
TIMING CONTROLLER
TC1 TC2 TC3
60
Cz
iii
SW4
Ci
Ai
ii
10
LO1
I1
Gnd
SW2
Iu
Ri
SW1
TC1
i
Vin REGISTER
40
DATA
LO3/TCn
viii
SW7
30
UP-DOWN COUNTER
TC2
D
R
U
O
50
CLOCK GENERATOR
CLK
EXT
vii
vi
SW6
LO2
SW5
LO1
20
LOGIC CIRCUIT
LO3
TC1/TC3
TCn
TC1 TC2 TC3
TIMING CONTROLLER
60
Cp
iv
Cm
v
Cz
iii
Ep
Em
SW4
TC2
Ci
Ai
ii
10
I2
I1
Vcc
Id
Iu
Gnd
SW3
SW2
SW1
Ri
TC1
Vin
i

INTEGRATION TYPE A/D CONVERSION METHOD, INTEGRATION TYPE A/D CONVERTER, AND BATTERY CHARGER UTILIZING SUCH CONVERTER

FIELD OF THE INVENTION

The invention relates to an integration type A/D conversion method, an integration type A/D converter, and a battery charger utilizing the integration type A/D converter, suitable for measurement of integrated DC currents.

BACKGROUND OF THE INVENTION

Batteries are used in a variety of fields including notebook type personal computers (PC), personal digital assistants (PDAs), digital still cameras (DSC), smart-phones, electric automobiles, and motor-assisted bicycles.

Batteries such as lithium ion batteries for use in notebook PCs are likely to burst if they are overcharged during charging. On the other hand, if they are discharged exceedingly above its allowable limit, their charging/discharging characteristics are deteriorated.

In order to circumvent such incidents, and take advantages of the battery performance, appropriate charging and discharging control suitable for the charging/discharging characteristics is required. For this purpose, there have been implemented in the past measurement devices for monitoring charging and discharging status of batteries.

A typical discrete measurement device measures a charging/discharging current that varies over a wide range (e.g. 0.5 mA–15 A), converts it to a voltage (5 $\mu$V–150 mV) and holds sampled voltage after it is amplified. This type of measurement device also includes a micro-controller unit (MCU) for converting the voltage into a digital signal by means of a multi-bit (e.g. 10 bits) sequential comparison type A/D converter and for averaging the data obtained.

Since the conventional measurement device integrates the charging/discharging current by accumulating the product of sampled discrete value and the sampling period, the integrated value inevitably has an error. In addition, precise measurement is difficult due to the fact that, since the dynamic range of the input signal is large, the measurement is influenced by a persistent weak current and noise. Further, in order to obtain practical accuracy in the averaging process, it is necessary to repeat a prolonged measurement using an MCU that consumes a fairly large current, which makes it difficult to reduce energy consumption.

FIG. 1 is a block diagram showing a conventional integration type A/D converter for integrating a continuous variable and converting it into a digital variable through A/D conversion. FIG. 2 is a timing diagram of the converter.

As seen in FIGS. 1 and 2, the integration circuit 701 of the converter is initially reset, providing zero Volt as the output Ea thereof (the output of the integration circuit hereinafter referred to as integral output voltage). Under this condition, a start pulse s is applied to a flip-flop 703, which turns on switch S1 and turns off switch S2 to couple the converter to an input signal Ei. Then the integration circuit 701 starts integration of the input signal Ei, generating an output voltage−Ei/RC. If the output Ea exceeds a comparative voltage−ΔVt, a comparative pulse p is generated, starting a first period of integration (the period hereinafter referred to as integration period). The integration period Ts is the time basis of the measurement.

AND circuit 706 is now opened to cause counter 704 to count the number of clock pulses issued from clock generator 705. As the count of the counter 704 reaches an overflow value Nm after a period Ts, an overflow pulse r is generated to reset the flip-flop 703.

Next, the switch Si is turned off and switch S2 turned on, switching the connection to a reference voltage of −Es, starting the integration of the current in a second integration period T. This results in an output of the integration circuit 701 having an opposite slope Es/RC as compared with the first integration. As the output Ea returns to −Δ t, the output of comparator 702 is inverted, closing the AND circuit 706. During this period, the counter 704 has been again counting the clocks starting from 1 after the overflow. The count N of the counter 704 at the time the AND circuit 706 is closed is proportional to the input signal Ei.

The value of the integration obtained by the integration circuit 701 in the first half of the integration is proportional to the level of the input signal Ei, while in the second half integration in the reverse direction the period T of integration is proportional to the level of the input signal Ei. That is, Ei·Nm=Es·N. Thus, the input signal Ei (=N·Es/Nm) is A/D converted by counting the clock pulses N during the period T. Such conventional integration type A/D converter has advantages in that it is not costly assembled and not strongly influenced by noise However, conventional A/D converters are limited in dynamic range, so that when the input current has a wide range of variation, as in the case of charging or discharging a battery, it is difficult to perform precise measurements using these converters. Moreover, in order to complete the A/D conversion quickly, the clock must have a high frequency, which disadvantageously results in a problem of large power consumption.

SUMMARY OF THE INVENTION

Thus, the invention is directed to solve the above mentioned problems pertinent to conventional A/D conversion circuits by providing an improved integration type A/D converter.

In accordance with one aspect of the invention, there is provided an integration type A/D converter, which comprises:

- an integration circuit for integrating an input signal to generate an integral output voltage (hereinafter referred to as integral output voltage);
- an integral output voltage reduction circuit for bringing said integral output voltage back to the initial level thereof by a predetermined magnitude per unit time upon receipt of a signal instructing reduction of said integral output voltage (said signal hereinafter referred to as integral output voltage reduction signal);
- a comparison circuit having at least one comparator for comparing said integral output voltage with a predetermined magnitude to generate a comparative output;
- a counter for counting clocks upon receipt of a signal instructing counting clocks (said signal hereinafter referred to as count instruction signal); and
- a control circuit for generating, upon receipt of said comparative output, said integral output voltage reduction signal and for generating said count instruction signal.

In accordance with another aspect of the invention, a battery charger is provided which is equipped with the A/D converter as described above.

In accordance with a further aspect of the invention, there is provided an integration type A/D conversion method, comprising:

a first step of integrating an input signal to generate an integral output voltage;

a second step of comparing said integral output voltage with a predetermined value to generate a comparative output;

a third step of generating an integral output voltage reduction signal and a count instruction signal upon receipt of said comparative signal;

a fourth step of bringing said integral output voltage back to the initial level thereof by a predetermined magnitude per unit time upon receipt of said integral output voltage reduction signal; and a fifth step of counting clocks upon receipt of said count instruction signal to output the digital-value of the clocks counted.

BRIEF DESCRIPTION OF THE DRAWINGS

Preferred embodiments of the invention will now be described in detail by way of example with reference to accompanying drawings, in which.

DETAILED DESCRIPTION OF THE PREFERRED EMBODIMENT

Figure 1:
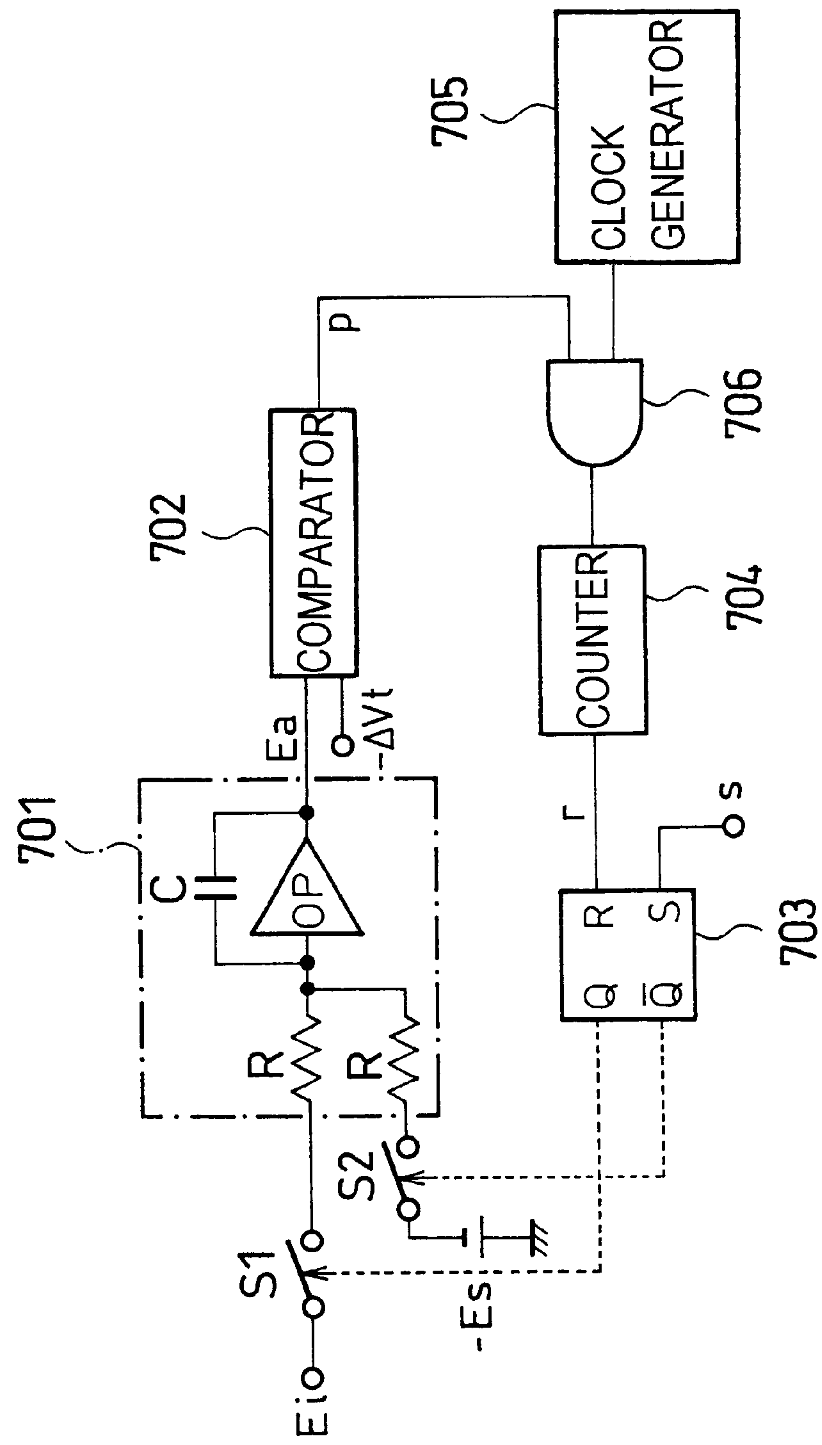
FIG. 1 is a block diagram representation of a conventional A/D converter.
Figure 2:
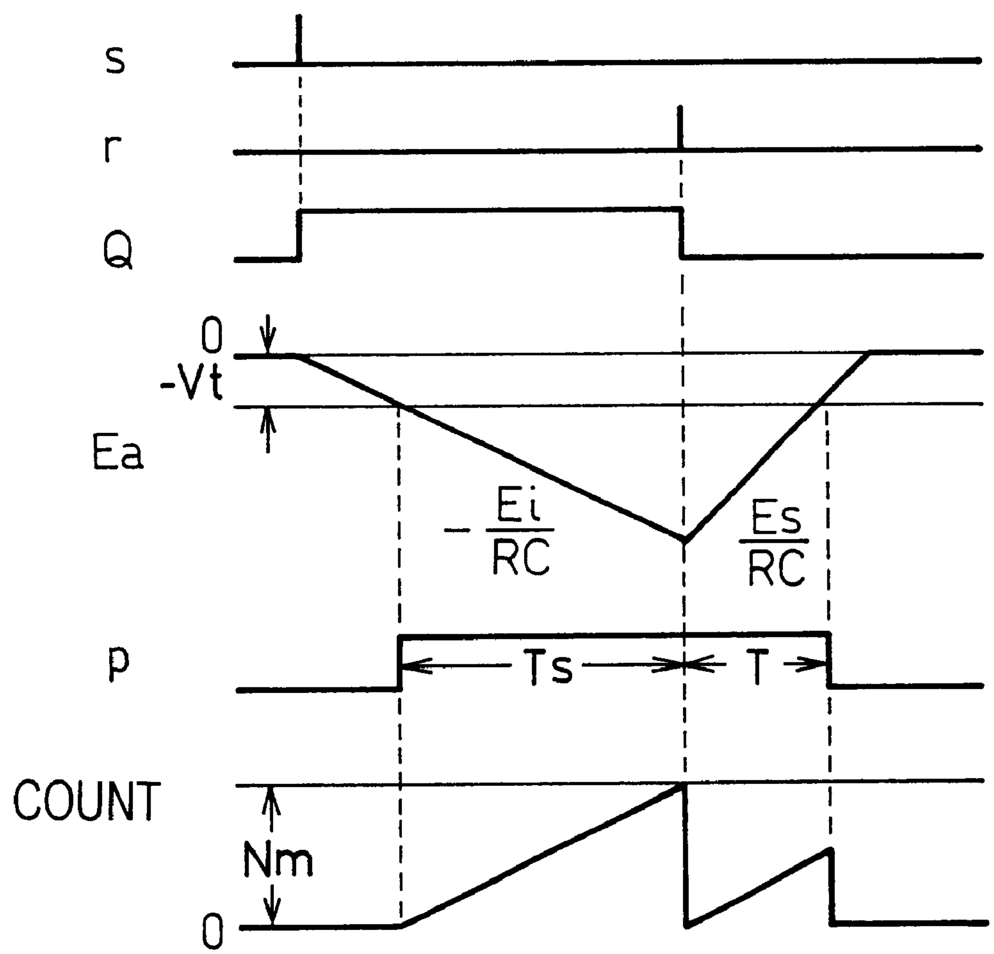
FIG. 2 is timing diagram of the A/D converter of FIG. 1.
Figure 3:
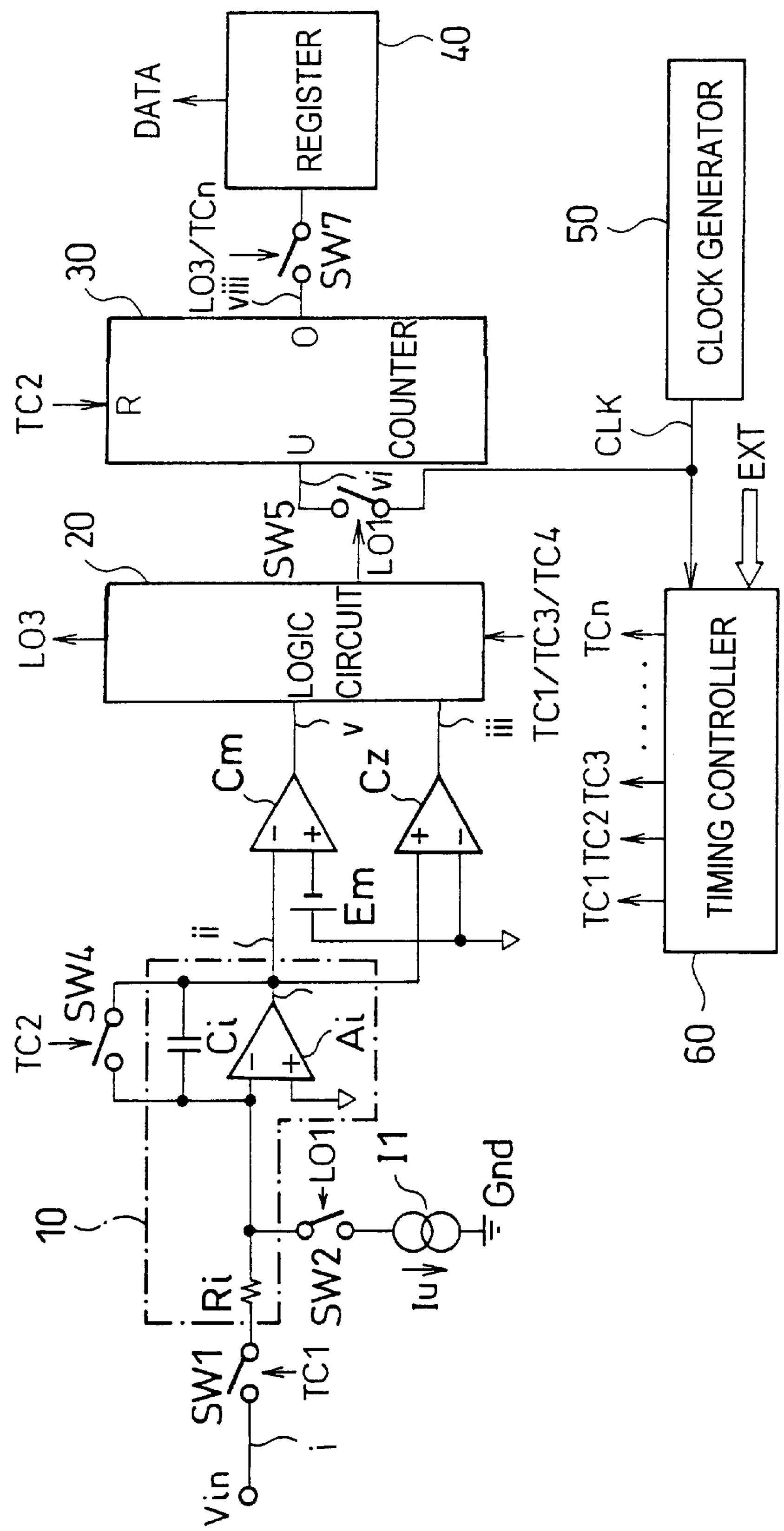
FIG. 3 is a block diagram representation of a battery charger utilizing an integration type A/D converter according to the invention.
Figure 4:
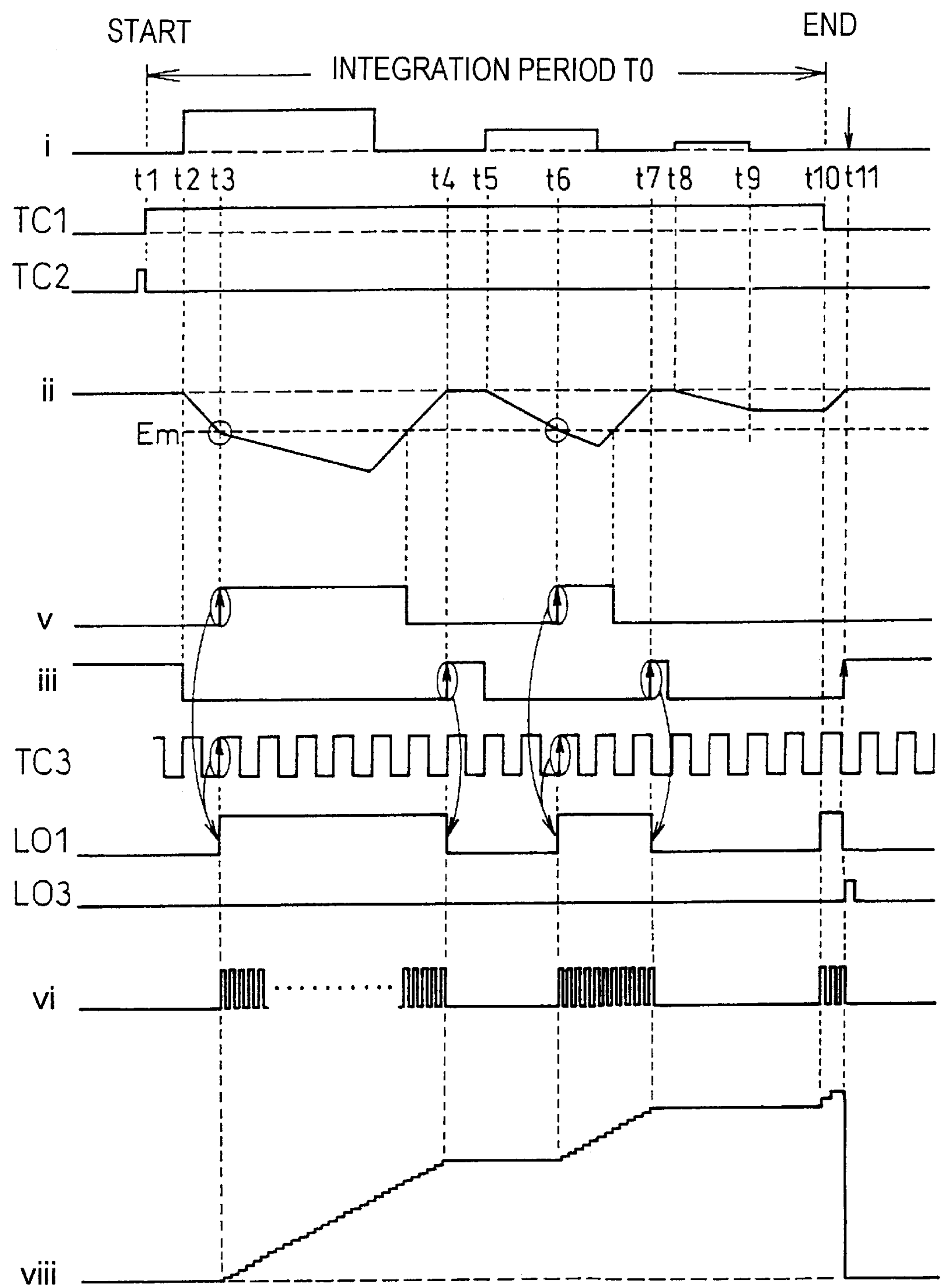
FIG. 4 is a timing diagram of the first integration type A/D converter shown in FIG. 3.

FIG. 3 is a block diagram representation of a first embodiment of an integration type A/D converter according to the invention. FIG. 4 is a timing diagram of the A/D converter.

The A/D converter integrates input signal Vin over an integration period T0 (period t1–t10 in FIG. 4) to convert (A/D convert) the signal. The integration period T0 can be set up for a single integration period and in succession for multiple integration periods. First, a fundamental case will be described in which a single period T0 is established for the integration The input signal Vin shown in FIG. 3 represents a voltage proportional to the charging or discharging current, obtained in the form of, for example, a voltage drop across an amperemeter measuring the current. It can widely range from 5 $\mu$L V to 150 mV for example. The input signal Vin is supplied to an integrator 10 while a switch SW1 is turned on by a control signal TC1 during an integration period T0.

The integrator 10 consists of a difference amplifier Ai, an input resister Ri connected to the inverting input terminal of the amplifier Ai, and a condenser Ci connected between the inverting input terminal and the output terminal of the amplifier Ai.

A constant current Iu is supplied to the inverting input terminal of the amplifier Ai from a constant current source I1 via a switch SW2. The current Iu is passed to the ground potential Vgnd. The switch SW2 is turned on over a period of time which starts when the negative output voltage (integral output voltage) of the integrator 10 exceeds, in absolute value, a negative reference voltage Em, and ends when the output voltage reduces to 0 Volt (second reference voltage), and over a period which starts when the integration period T0 ends for the integral output voltage being lower than the reference value Em, and ends when the integral output voltage becomes 0 Volt.

In what follows, it will be assumed, unless otherwise stated, that integral output voltages refer to absolute values. It will noted that the ground potential Vgnd appearing in the embodiments below can be replaced by an appropriate bias voltage, and that other voltages with reference to the ground potential Vgnd can be similarly replaced by corresponding voltages with reference to the bias voltage.

The magnitude of the constant current Iu is determined by the magnitudes of the input signal Vin and the dynamic range of the output of the integrator 10. In other words, the output level of the integrator is determined such that the output power of the integrator 10 due to the difference in charge between the charge accumulated on the condenser Ci by the input signal Vin during the integration period T0 and the charge discharged by the constant current Iu, stays within the dynamic range of the integrator 10. That is, $$\{(Vin/Ri)-Iu\}\times T0/Ci \leqq \text{Dynamic range of the integrator } \mathbf{10}.$$

The non-inverting input terminal of the Amplifier Ai is connected to the ground potential Vgnd. Connected between the terminals of the condenser Ci is a switch SW4, which is temporarily closed to eliminate the charge remaining on the condenser at the beginning of a new integration period T0. However, in cases where successive integration periods T0 are set up, the switch SW4 will not be closed in order to maintain the continuity of measurement.

A first comparator Cm is supplied at its inverting input terminal with an integral output voltage ii and at the non-inverting input terminal with a negative reference voltage Em, and generates a first high-level (H) comparative output v when the integral output voltage ii exceeds the voltage Em. The second comparator Cz is supplied at its non-inverting input terminal with the integral output voltage ii and at the inverting input terminal thereof with the ground potential Vgnd, and generates a second low-level (L) comparative output iii when the integral output voltage ii becomes a little greater than zero. The second comparator Cz is provided to determine if the voltage of the integral output voltage ii has neared zero volt (i.e. substantially zero volt), so that it can be anything so long as it fulfils this function.

A control logic circuit 20 (hereinafter referred to as logic circuit 20) generates an up-count signal LO1 upon receipt of the first comparative output v, the second comparative output iii, and a timing signal TC1.

The up-count signal LO1 is turned on during a period from the point in time that the first comparative output v is output (shifting from L to H) until the point in time that the second comparative output iii is not output any longer (corresponding to a shift from L to H), or when the second comparative output iii is output (L), from the point in time that the integration period T0 of the inventive integration type A/D converter is finished until the point in time that the second comparative output iii is not output any longer (corresponding to the shift from L to H).

A counter 30 has a clock input terminal U for up-counting clocks, count output terminal O, and a reset terminal R. The reset terminal R is applied with a timing signal TC2 for resetting the counter 30 at the beginning of a new integration period T0. The counter 30 is, however, reset for a subsequent measurement only after it has output the count viii when successive integration periods T0 are set up. This is because the continuity of measurement is required in the successive measurement. It will be understood that the counter 30 can be configured to be a down-counter.

The up-count clock input terminal U is supplied with clock signals CLK while a switch SW5 is closed by the up-count signal LO1, allowing the counter 30 to up-count the clocks.

A register 40 is supplied with a count viii of the counter 30 at the time a switch SW7 is closed, and generates an output data that includes extra information regarding the count such as a positive/negative sign and the number of integrations. The switch SW7 is turned on by a control signal when the count is made available, i.e. when the A/D conversion is finished at time t11. It is noted that when successive integration periods T0 are set up, the switch SW7 will be held turned on till the end of the integrations at time t11. The count for the integration will be output at t11.

A clock generator 50 supplies the counter 30 and a timing controller 60 with a clock signal CLK as a basis of time.

The timing controller 60 generates various timing signals TC1–TCn as needed in response to the clock signal CLK and other external operational signals EXT. The timing signal TC1 is generated consecutively during a given integration period, and supplied to the switch SW1 and the logic circuit 20. The timing signal TC2 is issued to the switch SW4 and the counter 30 at the very beginning of a new integration period T0. The timing signal TC3 to time the A/D conversion is provided to the logic circuit 20. The timing signal TC3 has a constant period, as shown in FIG. 4. Other timing signals may be formed as needed.

The operations of a first embodiment of an integration type A/D converter according to the invention will now be described with reference to FIG. 4. The following description applies to a single integration period T0.

The timing controller 60 is supplied with a clock signal CLK from the clock generator 50 and an instruction signal EXT from an external device. Upon the start of an integration period T0 (at t1), timing signal TC1 is provided to the switch SW1 by the timing controller 60 to close the switch during the integration period. At the same time, timing signal TC2 is supplied to the SW4 and the counter 30 from the timing controller 60 to thereby discharge electric charges remaining on the condenser Ci and reset the counter 30 to initialize the converter.

Following the start of the integration period T0, input signal Vin (input voltage i) is supplied (at time t2). As a result, the integration is performed by the integrator 10 for the input signal. The integral output voltage ii gradually increases with time in the negative direction in accordance with the input signal Vin of positive polarity. At the moment the integral output voltage ii exceeds the bias voltage Em of the first comparator Cm, the first comparative output v is output (transition from L to H) from the comparator Cm to the logic circuit 20. The first comparative output v is taken into the logic circuit 20 at the rise of the timing signal TC3 that defines the timing of A/D conversion, and generates an up-count signal LO1.

The up-count signal LO1 first closes the switch SW5. While the switch SW5 is closed, a clock signal CLK from the clock generator 50 is supplied to the up-count clock input terminal U of the counter 30 for up-counting by the counter 30. At the time the switch SW5 is closed, the up-count signal LO1 closes the switch SW2. While the switch SW2 is closed, the constant current Iu flows out of the condenser Ci of the integrator 10. In other words, a current representing the input signal Vin minus the constant current Iu flows into and out of the condenser Ci as the charging and discharging current, respectively.

Discharging of constant current In results in gradual decrease of the integral output voltage ii until it lowers below the bias voltage Em of the first comparator Cm, when the first comparative output v of the comparator Cm is stopped (v shifting from H to L). However, the operation of the circuit remains unchanged at this moment. As the integral output voltage ii further lowers to the level of discrimination voltage of the second comparator Cz, which is zero volt in this example, at time t4 say, the second comparative output iii stops (the output iii shifting from L to H). In response to termination of the second comparative output iii, the logic circuit 20 stops the up-count signal LO1. This causes the switch SW5 to be opened, which in turn causes the counter 30 to stop up-counting operation, and opens the switch SW2, thereby stopping the constant current Iu.

Thus, discharging of constant current Iu and up-counting are executed in parallel with the integration of the input signal Vin. As a result, A/D conversion proceeds simultaneously with the integration of the input signal Vin.

Operations during a period from t4 to t7 are similar to those described above, except that the value of the input signal Vin differs. For simplicity, therefore, details of the operation will be omitted.

Referring to FIG. 4, operations of the converter will now be described for an instance where the input signal Vin becomes very weak, after t8 for example. In this instance, the integral output voltage ii gradually increases in the negative direction in accordance with a minute input signal Vin. However, if the input signal Vin has disappeared at t9 before the integral output voltage ii exceeds the voltage Em of the first comparator, the integral output voltage ii is maintained as it is.

As the end of the integration period T0 at time t10, the second comparative output iii is output from the second comparator Cz, which closes the switches SW2 and SW5 to restart, at time t10, the constant current Iu and up-counting of clocks. This counting will be terminated at t11 when the second comparative output iii is stopped. That is; the A/D conversion ends at time t11. The logic circuit 20 provides the switch SW7 with a data outputting instruction signal LO3.

The up-count pulses vi during this period appear as shown in FIG. 4. The resultant count data viii (at time t11) is entered in register 40 as the cumulative measurement data.

The register 40 adds to the count data extra data which indicates the content of the data such as positive/negative sign and the number of integrations, and outputs the data.

In place of the first comparator Cm and the second comparator Cz of FIG. 3, a single comparator may be used which is characterized by a hysteresis that its output rises when the integral output voltage ii exceeds the first voltage Em and falls when the integral output voltage ii reduces to a predetermined second voltage e.g. zero Volt.

It will be apparent to a person skilled in the art that the single comparator having such hysteresis characteristic simplifies the A/D converter while attaining the same results as described above.

Alternatively, as a comparator of FIG. 3, a single simple comparison circuit may be used which generates a comparative output only when the integral output voltage ii exceeds a predetermined voltage. Such comparator can further simplify the A/D converter.

This simplified version, however, must undergo frequent switching operations of the switch SW2 for the constant current power source if the integral output voltage ii oscillates near said predetermined voltage, thereby possibly causing errors due to the noise accompanying the switching. Therefore, it is desirable to take into account the characteristics of the input signal when a simplified comparator is under consideration.

In this way, since counting clocks proceeds with the integration of the input, signal Vin (which is proportional to the charging and discharging current of a battery), the clock signal TC3 for the A/D conversion may be of low-frequency. Besides, the time required for the A/D conversion can be minimized.

It will be appreciated that the dynamic range of the A/D conversion can be extended in accordance with the invention in that the integral output voltage ii is reduced by discharging the constant current Iu at the point in time when the integration output ii has reached a predetermined voltage Em. It is therefore possible to raise the accuracy of A/D conversion for a given input signal Vin by regulating/adjusting the gain of an amplifier.

Next, operations during successive integrations (over multiple periods of T0) will now be described. The following description is primarily concerned with the difference in operation between a single integration and successive multiple integrations.

In multiple integrations, the next integration is immediately started after the completion of one integration. In this case, it is necessary to prevent the count of the counter 30 from overflowing due to counting over multiple integration periods T0. In view of this, the switch SW7 is closed to output the count of the counter 30 to the register 40 at the end of each integration, and the counter 30 is reset. To do this a timing signal TCn indicating each integration period T0 is generated and supplied by a timing controller 60.

In order to maintain the continuity of measurement over the successive integration periods T0, nothing is changed in other operations than outputting the count at the end of each integration period. Thus, all the switches SW1–SW6 remain in operation during the successive integration periods. That is, any operation proceeding at the end of each integration period T0 will be continued without any change until the end of the entire integration period, regardless at which point the integration is finished in time t1–t9 in the timing chart shown in FIG. 4.

As described above, the count data, i.e. input signal accumulated so far is output from the register 40 at the end of each integration period T0. Incidentally, if any integral output voltage remains in the integrator 10 at the end of the integration period T0, the count that corresponds to the integral output voltage is integrated with the integral output voltage in the next integration period.

In this way, in accordance with an integration type A/D converter of the invention, accumulation of input signal over a sequence of multiple integration periods, not executable in conventional integration type A/D converters, can be carried out.

Figure 5:
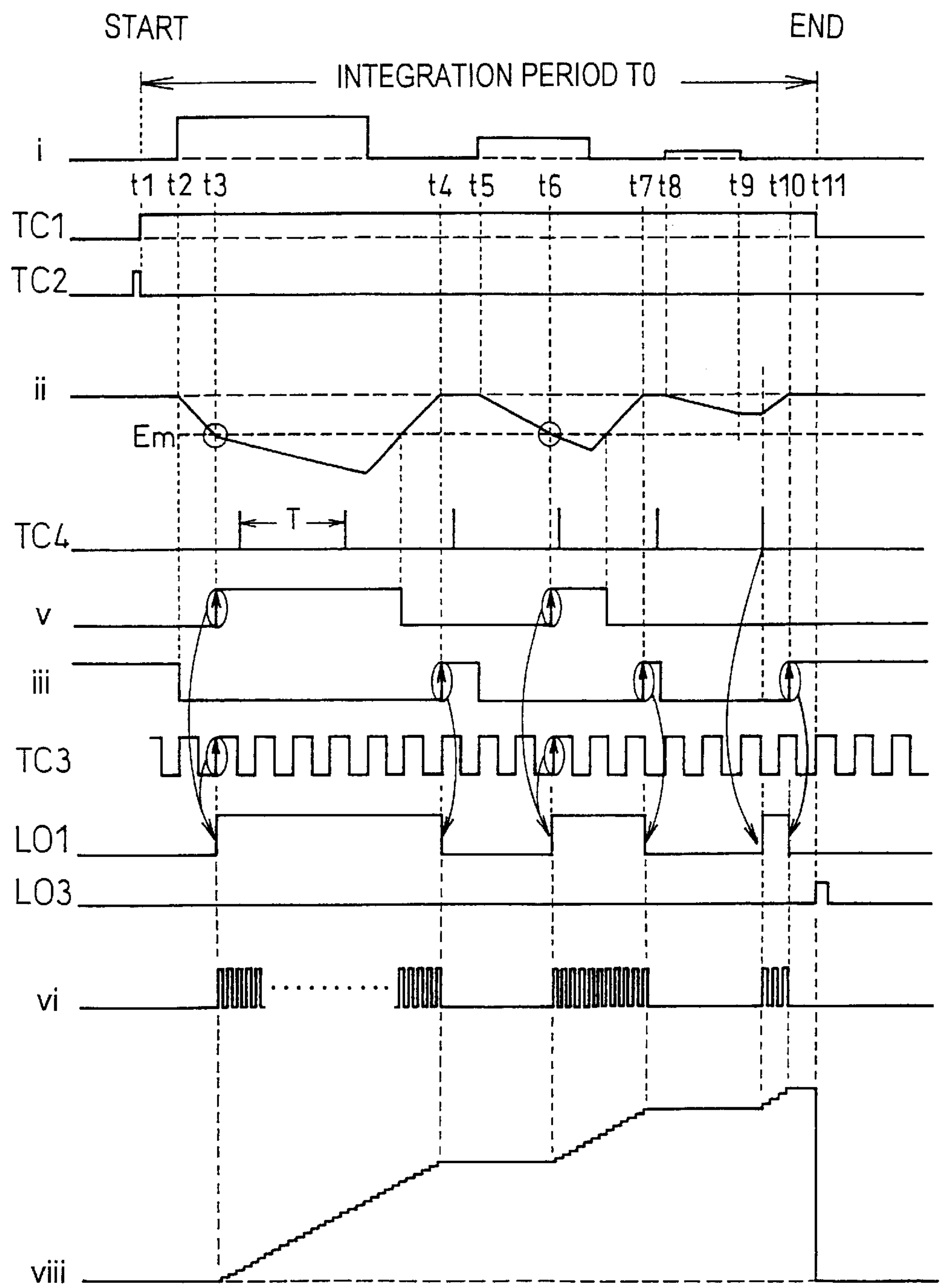
FIG. 5 is a timing diagram of the second integration type A/D converter according to the invention.

FIG. 5 is a timing chart of operations carried out by a second embodiment of an integration type A/D converter according to the invention. The second embodiment is similar in structure to that of the first embodiment shown in FIG. 3. The second embodiment, however, differs from the first embodiment in that the former utilizes a timing signal TC4 having a constant period that is not used in the latter. In what follows, therefore, for simplicity only the difference between the first and the second embodiments will be described.

In the second embodiment, the timing signal TC4 is generated in the timing controller 60, which is supplied to the logic circuit 20.

As a control means, the logic circuit 20 is supplied with a first high-level (H) comparative output v generated when the integral output voltage ii exceeds a predetermined voltage Em, a second low-level (L) comparative output iii generated when the integral output voltage ii is substantially zero, and the timing signal TC4. In response to each of these signals, the logic circuit 20 feeds the switch SW2 of the constant current source I1 and the switch SW5 of the counter 30 with the respective instruction signals.

First, in the control, up-count signal LO1 is provided to the switch SW2 of the constant current source I1 and the switch SW5 of the counter 30 in response to the first comparative output v, as in the first embodiment. The up-count signal LO1 is stopped in accordance with the second comparative output iii.

If particular conditions are met when the timing signal TC4 is generated, every time the timing signal TC4 is generated a determination is made whether the second comparative output iii is generated and whether an up-count signal LO1 is not supplied to the switches SW2 and SW5.

FIG. 5 illustrates where these two conditions are met. During an interval between t1 and t9, the two conditions are not met at the time the timing signal TC4 is generated. However, during an integration period between t9 and t10, the two conditions are met at the time the timing signal TC4 is generated.

Upon the establishment of the two conditions, the logic circuit 20 provides up-count signal LO1 to each of the switches SW2 and SW5, to thereby start counting clocks (i.e. A/D conversion). As a result of the A/D conversion, the integral output voltage ii diminishes towards zero. When the integral output voltage ii decreases to substantially zero Volt at time t10, the second comparative output iii is stopped. The termination of the second comparative output iii causes the up-count signal LO1 to be turned off, thereby stopping the A/D conversion.

In this way, in the second embodiment of an integration type A/D converter, in addition to the A/D conversion routines performed in the first embodiment, the level of the comparative output iii is evaluated at regular intervals, and based on the resultant level of the output iii, the constant current source I1 and the counter 30 are operated to start a new A/D conversion. The A/D conversion is stopped as the integral output voltage ii has diminished to zero, i.e. the second comparative output iii is stopped. Thus, since the A/D conversion is started by a predetermined period of T, time required to complete the A/D conversion subsequent to the integration period T0 is minimized.

Figure 6:
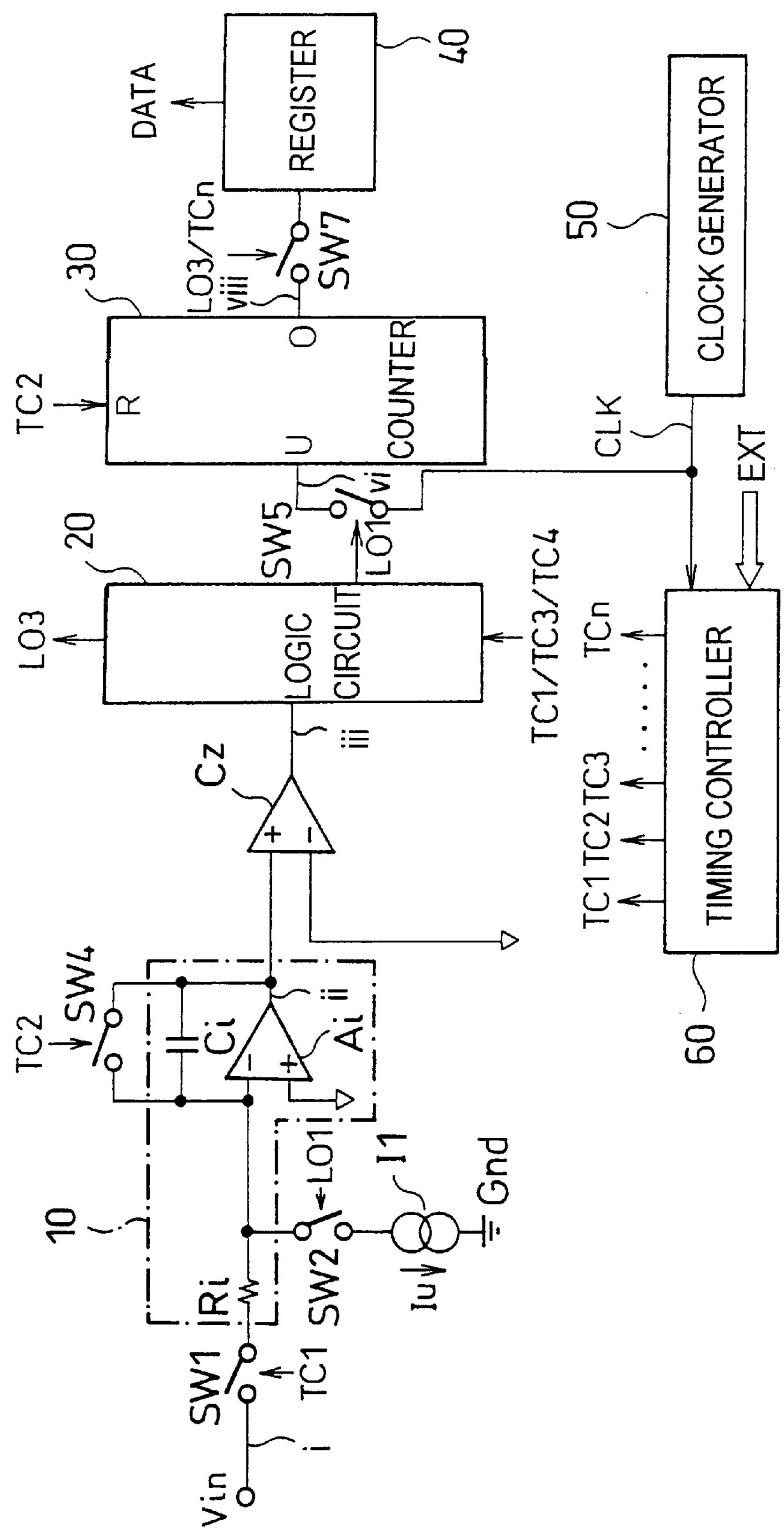
FIG. 6 is a third integration type A/D converter according to the invention.
Figure 7:
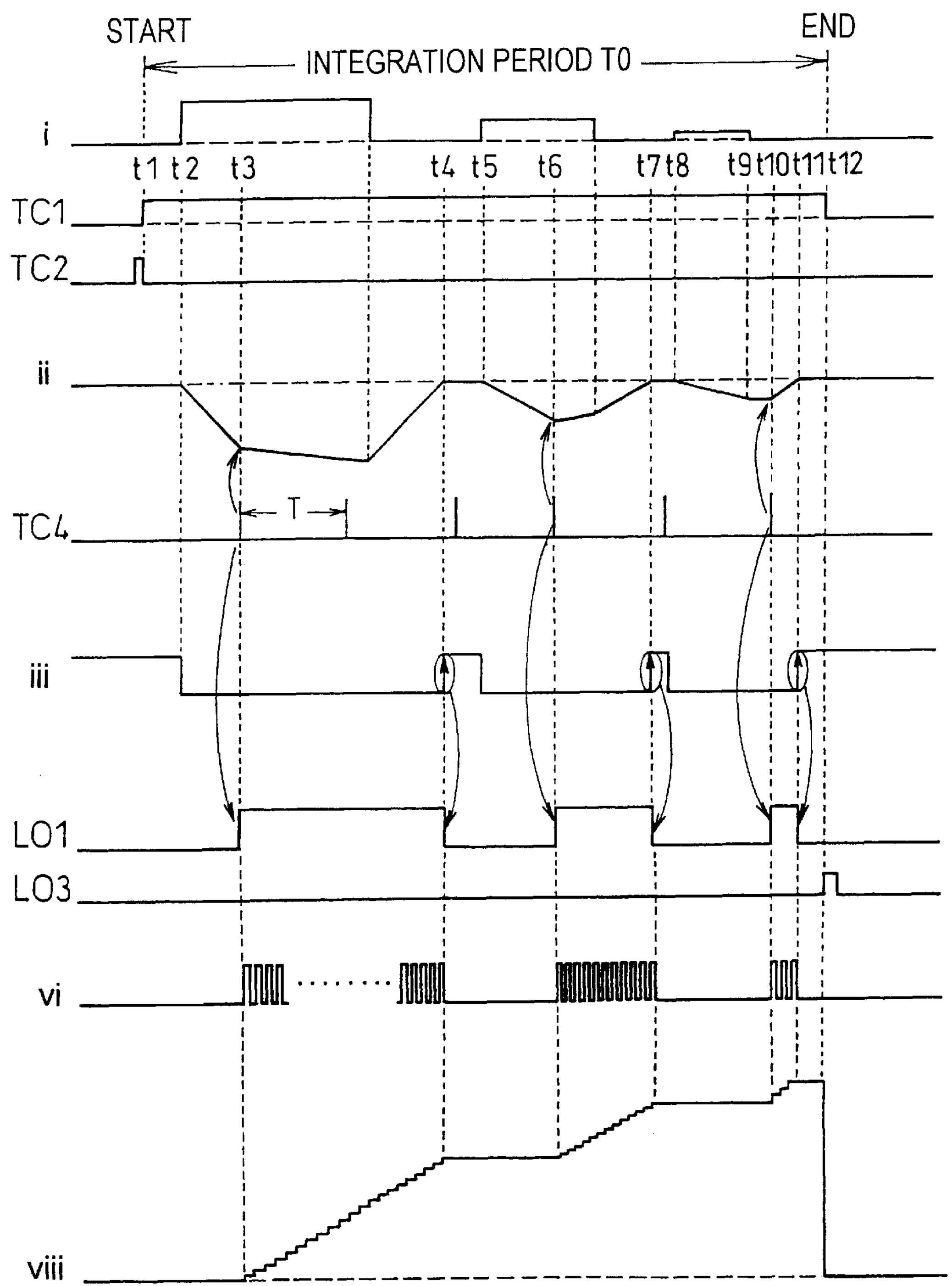
FIG. 7 is a timing diagram of the third integration type A/D converter shown in FIG. 6.

FIG. 6 illustrates a third embodiment of an integration type A/D converter according to the invention. FIG. 7 is a timing diagram of the A/D converter of FIG. 6.

The third embodiment differs from the second embodiment shown in FIGS. 3 and 5 in that the first comparator Cm of the latter is omitted in the former embodiment. Accordingly, the third embodiment is controlled in a different control scheme as compared with the second embodiment. In what follows only the difference between the two embodiments will be described, with neglect of other features.

In the third embodiment, the comparison circuit Cz provides an L-level comparative output iii when the integral output voltage ii exceeds a predetermined voltage near zero Volt.

The timing signal TC4 generated by the timing controller 60 at a regular period T is supplied to the logic circuit 20. The logic circuit 20 is supplied with the comparative output iii and the timing signal TC4. In response to each of these signals received, the logic circuit 20 provides up-count signal LO1 to the switch SW2 of the constant current source and the switch SW5 of the counter 30.

In this control, every time the timing signal TC4 is generated at said period, a determination is made if the following two conditions are satisfied:

(a) the integral output voltage ii has a non-zero value; and (b) up-count signal LO1 is not supplied to the switches SW2 and SW5 are satisfied.

FIG. 7 illustrates instances where these two conditions are met or not. For example, when the timing signal TC4 is generated at times t3, t6, and t10 during the integration period, the two conditions are satisfied.

Upon establishment of these conditions, the logic circuit 20 provides up-count signal LO1 to the switches SW2 and SW5 at time t3 (t6 and t10 also). As a result of the A/D conversion, the integral output voltage ii diminishes towards zero. When the integral output voltage ii decreases to substantially zero Volt at time t4 (t7 and t11 also), the second comparative output iii ceases to be generated.

With the termination of the second comparative output iii, coupling of the up-count signal LO1 with the switches SW2 and SW5 is cut off, to thereby end the A/D conversion.

Except for the times at t3, t6 and t10, the comparative output iii is not generated when the timing signal TC4 is generate, or the A/D conversion is already in process, so that no new A/D conversion will be initiated.

In this manner, in the third embodiment of an integration type A/D converter, the level of the comparative output iii is evaluated every time the timing signal TC4 is provided at a regular interval T, and based on the resultant level of the output iii, the constant current source I1 and the counter 30 are operated to start a new A/D conversion, which conversion is stopped when the integral output voltage ii diminishes to zero Volt, i.e. when the comparator Cz stops issuing a meaningful output signal. Thus, since the A/D conversion is started by a predetermined timing of period T, time required to complete the A/D conversion subsequent to the integration period can be minimized.

It will be appreciated that useless switching operations of the switch SW2 of the constant current source I1 are avoided in the third embodiment, which helps reduce errors due to switching noise generated by the switching.

It is noted that the comparison circuit is formed only of comparators Cz, thereby simplifying the structure of the integration type A/D converter.

Figure 8:
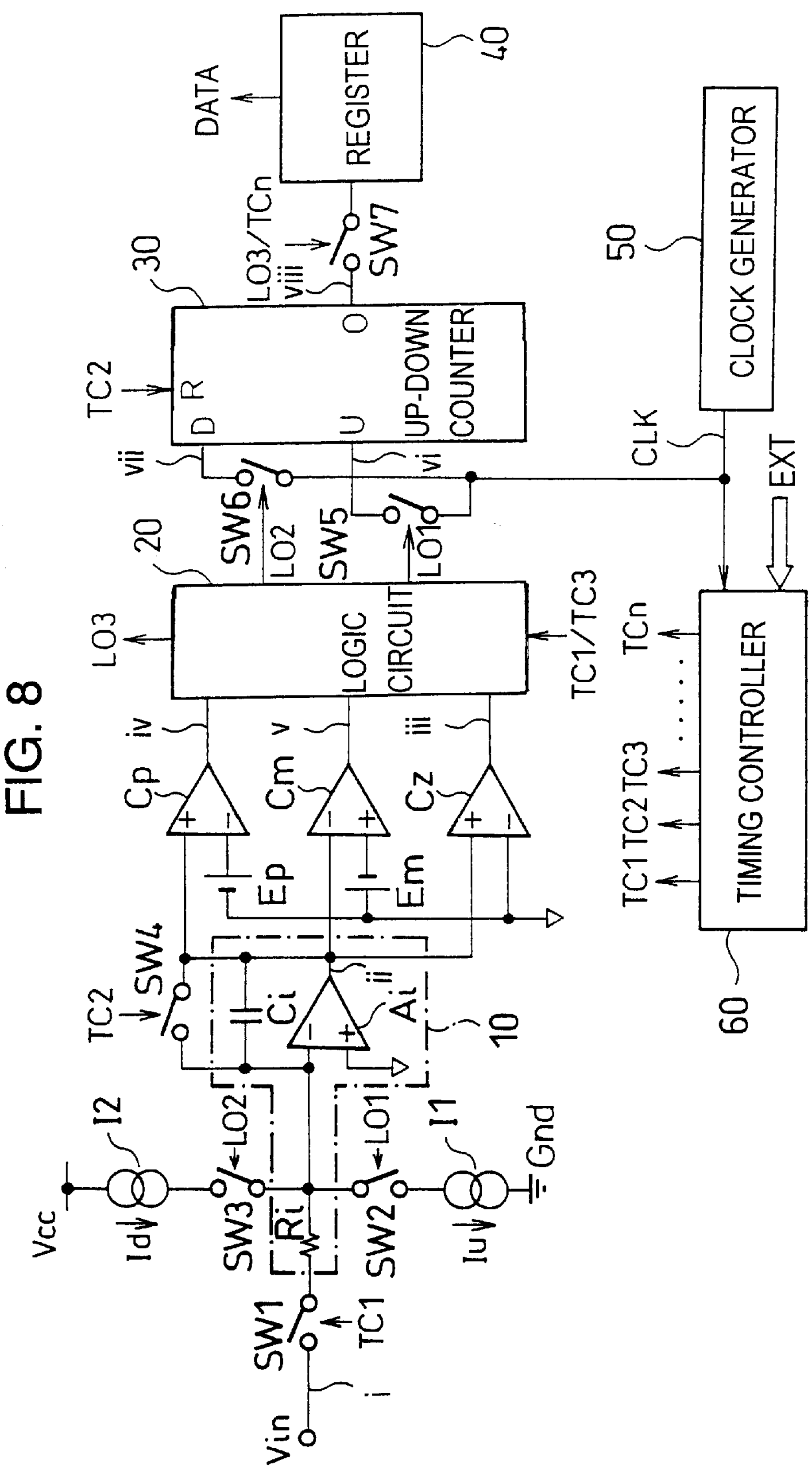
FIG. 8 is a fourth integration type A/D converter according to the invention.
Figure 9:
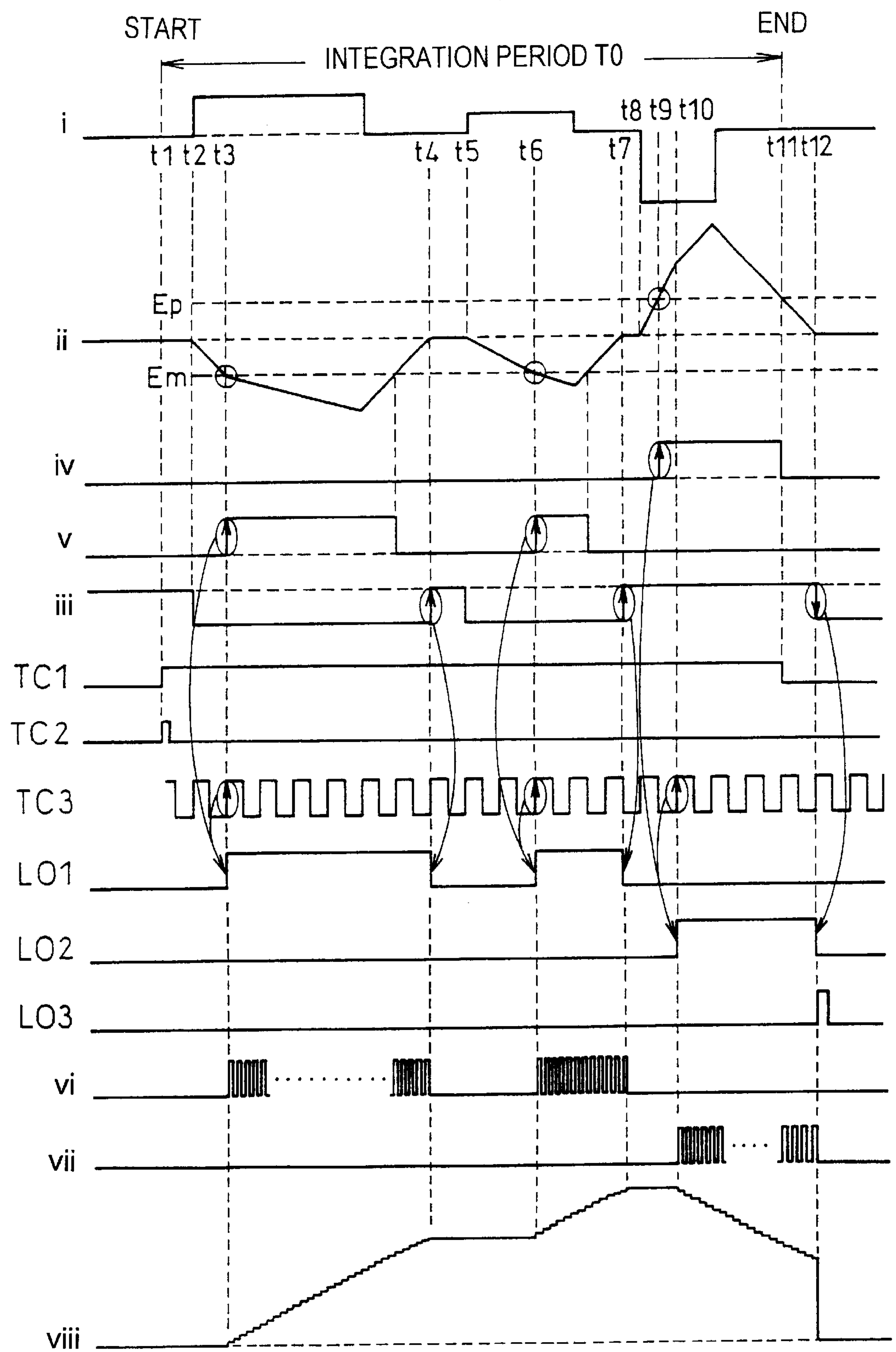
FIG. 9 is a timing diagram of the fourth integration type A/D converter shown in FIG. 8.

FIG. 8 is a block diagram representation of a fourth embodiment of an integration type A/D converter according to the invention. FIG. 9 is a timing diagram of the A/D converter of FIG. 8.

It will be recalled that in the first through the third embodiments, input signal Vin has been presumed to be a positive one (i.e. signal of a single polarity). In implementing the inventive integration type A/D converter in accumulative measurements of charging and discharging current of a battery for example, it is necessary to adapt the A/D converter to deal with input signals having not only a positive polarity but also a negative polarity, or both polarities.

As seen in the above description, the fourth embodiment can deal with an input signal having both positive and negative polarities, which may be typically cast into the first embodiment (FIGS. 3 and 4) if the signal has only a positive polarity.

An embodiment shown in FIG. 8 has an additional capability to deal with both polarities, with an additional modification as compared with the foregoing embodiments. In what follows these modification and addition will be described.

The integrator 10 is supplied at the inverting terminal thereof with an input signal Vin through a resistor Ri, and a constant current Id from a constant current source I2 connected to a power supply Vcc, via a switch SW3. The switch SW3 is switched on as the output voltage of the integrator 10 exceeds a predetermined level Ep and remains on until the output decreases to zero Volt, or over a period for which the positive output voltage of the integrator 10 decreased to zero Volt after the integration period of the A/D converter ended.

A third comparator Cp is supplied at the non-inverting input terminal thereof with the integral output voltage ii, and at the inverting input terminal thereof with a predetermined voltage Ep, so that it outputs a third comparative output iv when the integral output voltage ii exceeds the voltage Ep.

Upon receipt of the first though the third comparative outputs v, iii, and iv, respectively, and a timing signal, the logic circuit 20 generates an up-count signal LO1 and a down-count signal LO2, along with a data output instruction signal LO3, at its respective output terminals as shown in FIG. 8.

The up-count signal LO1 remains active until the second comparative output iii is inverted after the first comparative output v was issued, or until a negative or low (L) second comparative output iii (which corresponds to a negative output of the integrator 10) is inverted to H after the integration period of the A/D converter is ended.

The down-count signal LO2 remains active, after the third comparative output iv is output, until the second comparative output iii is inverted, or, after the integration period of the A/D conversion is ended, until a high (H) second comparative output iii (which corresponds to the output of the integrator 10 being positive) is inverted.

The up-down (U/D) counter 30 has an up-count terminal U, a down-count terminal D, count output terminal O, and a reset terminal R. The reset terminal R is supplied with a timing signal for resetting the count at the initiation of a new integration period. In order to maintain the continuity of the measurement in cases where multiple integration periods are set up, the counter 30 is reset only after it has output the current count, and a subsequent counting operation is allowed thereafter.

The up-count terminal U is coupled to a clock signal while the switch SW5 is closed by the up-count signal LO1 to perform up-counting. The down-count terminal D is coupled to a clock signal while the switch SW6 is closed by the down-count signal LO2 to perform down-counting.

The timing diagram of the fourth embodiment of an integration type A/D converter is shown in FIG. 9. When compared with FIG. 4, the timing of FIG. 9 has period for which the input signal Vin has a negative polarity over a period from t8 to t12. The description below concerns the operations after t8.

Referring to FIG. 9, when an input signal Vin of negative polarity takes place at time t8, integral output voltage ii begins to increase in the direction of positive voltage. At time t9 when the integral output voltage ii exceeds the bias voltage Ep of the third comparator Cp, the third comparative output iv rises. The third comparative output iv is supplied to the logic circuit 20. The logic circuit 20 generates a down-count signal LO2 at time t10 when the logic circuit 20 receives both the third comparative output iv and the timing signal TC3.

The down-count signal LO2 is first supplied to the switch SW6 to close it. While the switch SW6 is closed, clock signal from the clock generator 50 is supplied to the down-count terminal D of the U/D counter 30 to down-count the count of the counter 30. At the same time, down-count signal LO2 is supplied to the switch SW3 to close it. While the switch SW3 is closed, the constant current Id flows into the condenser Ci of the integrator 10. In other words, a current equal to the difference between the current generated by the input-signal Vin and the constant current Id flows into or out of the condenser Ci for charging or discharging, respectively.

The integral output voltage ii is gradually recovered by charging the constant current Id until it becomes as low as the bias voltage Ep of the third comparator Cp, which causes the third comparative output iv of the third comparator Cp to fall. At this stage, nothing changes in the A/D converter circuit.

If the current integration period has come to an end at an intermediate time t11 say during restoration of the integral output voltage ii by the constant current Id, the timing signal TC1 from the timing controller 60 is turned off at this moment t11, and the switch SW1 is opened.

However, at this moment t11, since the A/D conversion is in the middle of the conversion process that the A/D conversion is continued after the integration period has ended. As the integral output voltage ii is further restored and reaches the reference voltage (zero volt) at t12, the comparative output iii is inverted, which is fed to the logic circuit 20. In the logic circuit 20, the down-count signal LO2 is stopped by the inversion of the comparative output iii. This causes the switch SW6 to be opened, the U/D counter 30 to stop its down-counting, the switch SW3 to be opened to stop the constant current Id. The logic circuit 20 provides data output instruction signal LO3 to the switch SW7.

The up-count pulses vi and down-count pulses vii during this period are shown in FIG. 9. As a result, the count data viii of the U/D counter 30 (at time t11 or t12) is entered in the register 40 via the switch SW7.

The register 40 generates an output data which includes the input count data and additional information on the content of the data such as the sign of the data.

In cases (not shown in FIG. 9) where the output voltage of the integrator 10 remains below the bias voltage Em (or bias voltage Ep) of the comparator Cm (or comparator Cp) all the time till the expiration of the integration period, it is necessary to prevent the small integral output voltage from being a source of error.

To do this, at time t11 at which the integration period ended, in accordance with the inversion (from positive to negative and vise versa) of the comparative output iii of the comparator Cz, the switches SW2 and SW5 are closed to allow the constant current Iu to be the discharged and up-counting to be performed. Or alternatively, the switches SW3 and SW6 may be closed to allow the constant current Id to flow in and down-counting to be performed. The counting is terminated at the moment that the comparative output iii of the comparator Cz is inverted.

In this way, depending upon the polarity of the output of the integrator, a constant current is flown in the direction to decrease the integration value, with the U/D counter up-counting or down-counting clocks. Thus, the same A/D converter may be used to integrate both positive and negative input currents.

The above described integration type A/D converter of the invention can be used in battery charger. Such battery charger can accurately and economically obtain integrated value(s) of charging and discharging current.

What we claim is:

1. An integration type A/D converter, comprising:

an integration circuit for integrating an input signal to generate an integral output voltage;

an integral output voltage reduction circuit for bringing said integral output voltage back to the initial level thereof by a predetermined magnitude per unit time upon receipt of an integral output voltage reduction signal;

a comparison circuit having at least one comparator for comparing said integral output voltage with a predetermined value to generate a comparative output;

a counter for counting clocks upon receipt of a signal instructing counting clocks (said signal hereinafter referred to as count instruction signal); and a control circuit for generating, upon receipt of said comparative output, said integral output voltage reduction signal and said count instruction signal, and wherein said comparison circuit has a first comparator for generating a first comparative output when said integral output voltage exceeds in absolute value a negative predetermined level;

a second comparator for generating a second comparative output when said integral output voltage is substantially zero; and a third comparator for generating a third comparative output when said integral output voltage exceeds a positive predetermined level, said counter is an up-down counter that counts up said clocks upon receipt of an up-count instruction signal and counts down said clocks upon receipt of a down-count signal; and said control circuit generates said integral output voltage reduction signal and up-count instruction signal during a period which begins with the generation of said first comparative output and ends with the generation of said second comparative output, and generates said integral output voltage reduction signal and said down-count instruction signal during a period which begins with the generation of said third comparative output and ends with the generation of said second comparative output.

2. A battery charger having an integration type A/D converter, said A/D converter comprising:

an integration circuit for integrating an input signal to generate an integral output voltage;

an integral output voltage reduction circuit for bringing said integral output voltage back to the initial level thereof by a predetermined magnitude per unit time upon receipt of an integral output voltage reduction signal;

a comparison circuit having at least one comparator for comparing said integral output voltage with a predetermined value to generate a comparative output;

a counter for counting clocks upon receipt of a count instruction signal; and a control circuit for generating, upon receipt of said comparative output, said integral output voltage reduction signal and said count instruction signal, and wherein said comparison circuit has a first comparator for generating a first comparative output when said integral output voltage exceeds in absolute value a negative predetermined level;

a second comparator for generating a second comparative output when said integral output voltage is substantially zero; and a third comparator for generating a third comparative output when said integral output voltage exceeds a positive predetermined level, said counter is an up-down counter that counts up said clocks upon receipt of an up-count instruction signal and counts down said clocks upon receipt of a down-count signal; and said control circuit generates said integral output voltage reduction signal and up-count instruction signal during a period which begins with the generation of said first comparative output and ends with the generation of said second comparative output, and generates said integral output voltage reduction signal and said down-count instruction signal during a period which begins with the generation of said third comparative output and ends with the generation of said second comparative output.

3. An integration type AID conversion method, comprising:

a first step of integrating an input signal to generate an integral output voltage;

a second step of comparing said integral output voltage with a predetermined value to generate a comparative output;

a third step of generating an integral output voltage reduction signal and a count instruction signal upon receipt of said comparative signal;

a fourth step of bringing said integral output voltage back to the initial level thereof by a predetermined magnitude per unit time upon receipt of said integral output voltage reduction signal; and a fifth step of counting clocks upon receipt of said count instruction signal to output the counts of clocks counted, and wherein in said second step, a first comparative output is generated when said integral output voltage exceeds in absolute value a negative predetermined level;

a second comparative output is generated when said integral output voltage is substantially zero; and a third comparative output is generated when said integral output voltage exceeds a positive predetermined positive level;

in said third step, said integral output voltage reduction signal and said up-count instruction signal are generated during a period which begins with the generation of said first comparative output and ends with the generation of said second comparative output, and said integral output voltage reduction signal and said down-count instruction signal are generated during a period which begins with the generation of said third comparative output and ends with the generation of said second comparative output.

* * * * *